(12) United States Patent
Hong et al.

(10) Patent No.: US 11,848,303 B2
(45) Date of Patent: Dec. 19, 2023

(54) ELECTRONIC DEVICE AND METHOD OF TRANSFERRING ELECTRONIC ELEMENT USING STAMPING AND MAGNETIC FIELD ALIGNMENT

(71) Applicant: SEOUL NATIONAL UNIVERSITY R&DB FOUNDATION, Seoul (KR)

(72) Inventors: Yongtaek Hong, Seoul (KR); Hyungsoo Yoon, Seoul (KR); Eunho Oh, Seoul (KR); Byeongmoon Lee, Seoul (KR); Sujin Jeong, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 17/744,177

(22) Filed: May 13, 2022

(65) Prior Publication Data

US 2022/0271004 A1  Aug. 25, 2022

Related U.S. Application Data

(62) Division of application No. 16/996,446, filed on Aug. 18, 2020.

(51) Int. Cl.
  *H01L 23/00* (2006.01)
  *H01L 33/62* (2010.01)
  *H01L 25/075* (2006.01)

(52) U.S. Cl.
  CPC .............. *H01L 24/83* (2013.01); *H01L 24/27* (2013.01); *H01L 24/32* (2013.01);
  (Continued)

(58) Field of Classification Search
  None
  See application file for complete search history.

(56) References Cited

U.S. PATENT DOCUMENTS 9,777,192 B2 * 10/2017 Li ..................... H01L 21/30625
9,777,197 B2    10/2017 Khanna
(Continued)

FOREIGN PATENT DOCUMENTS

JP    2015-005625 A       1/2015
JP    2020107711 A  *    7/2020    ......... H01L 23/4828
(Continued)

OTHER PUBLICATIONS

United States Office Action, U.S. Appl. No. 16/996,446, dated Mar. 30, 2023, 12 pages.
(Continued)

*Primary Examiner* — Nishath Yasmeen
(74) *Attorney, Agent, or Firm* — FENWICK & WEST LLP

(57) ABSTRACT

The present disclosure provides a method of transferring an electronic element using a stamping and magnetic field alignment technology and an electronic device including an electronic element transferred using the method. In the present disclosure, a polymer may be simultaneously coated on a plurality of electronic elements using the stamping process, and the polymer may be actively coated on the electronic elements without restrictions on process parameters such as size and spacing of the electronic elements. Moreover, the self-aligned ferromagnetic particles have an anisotropic current flow through which current flows only in the aligned direction. Therefore, the current may flow only vertically between the electronic element and the electrode, and there is no electrical short circuit between a peripheral LED element and the electrode.

9 Claims, 18 Drawing Sheets

(52) U.S. Cl.
CPC .......... *H01L 25/0753* (2013.01); *H01L 33/62* (2013.01); *H01L 2224/2744* (2013.01); *H01L 2224/32227* (2013.01); *H01L 2224/83005* (2013.01); *H01L 2224/83143* (2013.01); *H01L 2224/83203* (2013.01); *H01L 2224/83851* (2013.01); *H01L 2224/83862* (2013.01); *H01L 2224/83868* (2013.01); *H01L 2224/83871* (2013.01); *H01L 2224/83874* (2013.01); *H01L 2224/83986* (2013.01)

(56) References Cited

U.S. PATENT DOCUMENTS

| | | | |
|---|---|---|---|
| 10,797,199 | B2 | 10/2020 | Yoon et al. |
| 2001/0016435 | A1 | 8/2001 | Fujimura |
| 2006/0076692 | A1 | 4/2006 | Lee et al. |
| 2014/0353540 | A1 | 12/2014 | Khanna |
| 2015/0171297 | A1 | 6/2015 | Rhee et al. |
| 2017/0059960 | A1 | 3/2017 | Shi et al. |
| 2017/0062379 | A1* | 3/2017 | Zhang .................... H01L 24/16 |
| 2017/0131586 | A1 | 5/2017 | Nakayama et al. |
| 2018/0151849 | A1 | 5/2018 | Kim et al. |
| 2018/0182944 | A1* | 6/2018 | Miles .................. H01L 21/6836 |
| 2019/0027639 | A1 | 1/2019 | Yoon et al. |

FOREIGN PATENT DOCUMENTS

| | | | |
|---|---|---|---|
| KR | 10-2006-0050656 A | | 5/2006 |
| KR | 10-0849814 B1 | | 7/2008 |
| KR | 10-0955500 B1 | | 4/2010 |
| KR | 10-1255775 B1 | | 4/2013 |
| KR | 10-2019-0009045 A | | 1/2019 |
| KR | 10-2021-0140886 | * | 2/2020 |
| WO | WO 2010/005138 A1 | | 1/2010 |

OTHER PUBLICATIONS

United States Office Action, U.S. Appl. No. 16/996,446, dated Sep. 30, 2022, 18 pages.
United States Office Action, U.S. Appl. No. 16/996,446, dated Apr. 4, 2022, 8 pages.

* cited by examiner

ELECTRONIC DEVICE AND METHOD OF TRANSFERRING ELECTRONIC ELEMENT USING STAMPING AND MAGNETIC FIELD ALIGNMENT

CROSS-REFERENCE TO RELATED APPLICATION

This application is a divisional of U.S. patent application Ser. No. 16/996,446 filed on Aug. 18, 2020, which is incorporated by reference in its entirety.

BACKGROUND

1. Field

The present disclosure relates to a method of transferring an electronic element using a stamping and magnetic field alignment technology and an electronic device including an electronic element transferred using the method, and more specifically, to a transferring method including a stamping technology capable of dramatically simplifying a transferring process by simultaneously patterning and coating a polymer to a plurality of elements and a self-aligning technology capable of fixing and electrically connecting a micro light emitting diode (LED) element to a lower electrode, and electronic device including an electronic element transferred using the method.

2. Description of the Related Art

A transferring process is a process of moving an electronic element from a carrier to a substrate on which other components are disposed, and is a core technology for realizing a micro LED display. Conventionally, a pick-and-place transferring process, which is a method of picking up an individual transfer element from a carrier and placing the element at a desired location of the substrate, has been mainly applied.

However, in order to realize 4K resolution using the pick-and-place transferring process, 24 million LED elements must be arranged in a circuit, which becomes more inefficient and unproductive as being applied to higher resolution and larger area. In addition, as the size and spacing of individual electronic elements are smaller, the pick-and-place machine must have higher precision, but the mechanical precision of the machine cannot keep up with the miniaturization of elements and the degree of integration of the circuit. Thus, there are limitations in transferring micro-sized electronic elements using the pick-and-place transferring process.

Accordingly, there is a need for a method and process for more efficiently transferring a micro-sized electronic element that may meet high-resolution and large-area applications.

SUMMARY

The present disclosure is designed to solve the conventional problems, and the present disclosure is directed to provide a technique for efficiently transferring electronic elements such as micro LEDs in an array unit, rather than an existing pick-and-place transferring process. In addition, the present disclosure is directed to proposing a technical means for two aforementioned factors involved in the micro LED transcription process.

A method of transferring an electronic element according to an embodiment of the present disclosure comprises: preparing a first substrate having an electronic element array arranged on one surface thereof and a second substrate having a polymer with ferromagnetic particles formed on one surface thereof; coating the polymer on the electronic element array by bringing the electronic element array of the first substrate and the polymer of the second substrate into contact; preparing a third substrate having an electrode formed on at least one surface thereof and corresponding to the electronic element array; bringing the polymer coated on the electronic element array of the first substrate and the electrode of the third substrate into contact; arranging the ferromagnetic particles in the polymer to electrically connect the electronic element array and the electrode by forming a magnetic field between the first substance and the third substrate; and curing the polymer to fix the state of the arranged ferromagnetic particles.

An electronic device according to another embodiment of the present disclosure comprises: a substrate; an electrode formed on the substrate; an electronic element electrically connected to the electrode; and a cured polymer positioned between the electrode and the electronic element, wherein the cured polymer includes a plurality of ferromagnetic particles arranged in one direction, and the electrode and the electronic element are electrically connected through the plurality of ferromagnetic particles.

In the present disclosure, a polymer may be simultaneously coated on a plurality of electronic elements using the stamping process, and the polymer may be actively coated on the electronic elements without restrictions on process parameters such as size and spacing of the electronic elements. In addition, since the polymer remaining after stamping may be recycled, the present disclosure is advantageous for mass production and repetitive processes.

Moreover, the self-aligned ferromagnetic particles have an anisotropic current flow through which current flows only in the aligned direction. Therefore, the current may flow only vertically between the electronic element and the electrode, and there is no electrical short circuit between a peripheral LED element and the electrode. Thus, the present disclosure may cope with fine patterning.

The present disclosure is a high value-added technology because efficient electronic element transfer technology may be applied regardless of size from small displays to large displays. Accordingly, the electronic device may realize high resolution through a high degree of integration, and thus has a high possibility of application to future displays such as augmented reality (AR), virtual reality (VR), displays for vehicles, flexible and stretchable displays, and the like.

The effects that can be obtained from the present disclosure are not limited to those mentioned above, and other effects not mentioned herein will be clearly understood by those skilled in the art from the following description.

DETAILED DESCRIPTION

The following detailed description of the present disclosure refer to the accompanying drawings that show specific embodiments for implementing the present disclosure as examples. The embodiments of the detailed description are provided for the purpose of disclosing detailed descriptions for those skilled in the art to implement the present disclosure.

Embodiments of the present disclosure may be explained as being different from each other, but it does not mean that the embodiments are exclusive from each other. For example, specific shapes, structures and characteristics described in connection with one embodiment of the detailed description may be implemented in the same manner in other embodiments without departing from the idea and scope of the present disclosure. In addition, it should be understood that positions or arrangements of individual components of the embodiments disclosed herein can be variously changed without departing from the idea and scope of the present disclosure. In the accompanying drawings, the size of each component may be exaggerated for explanation, and need not be the same or similar to the size actually applied.

Figure 1:
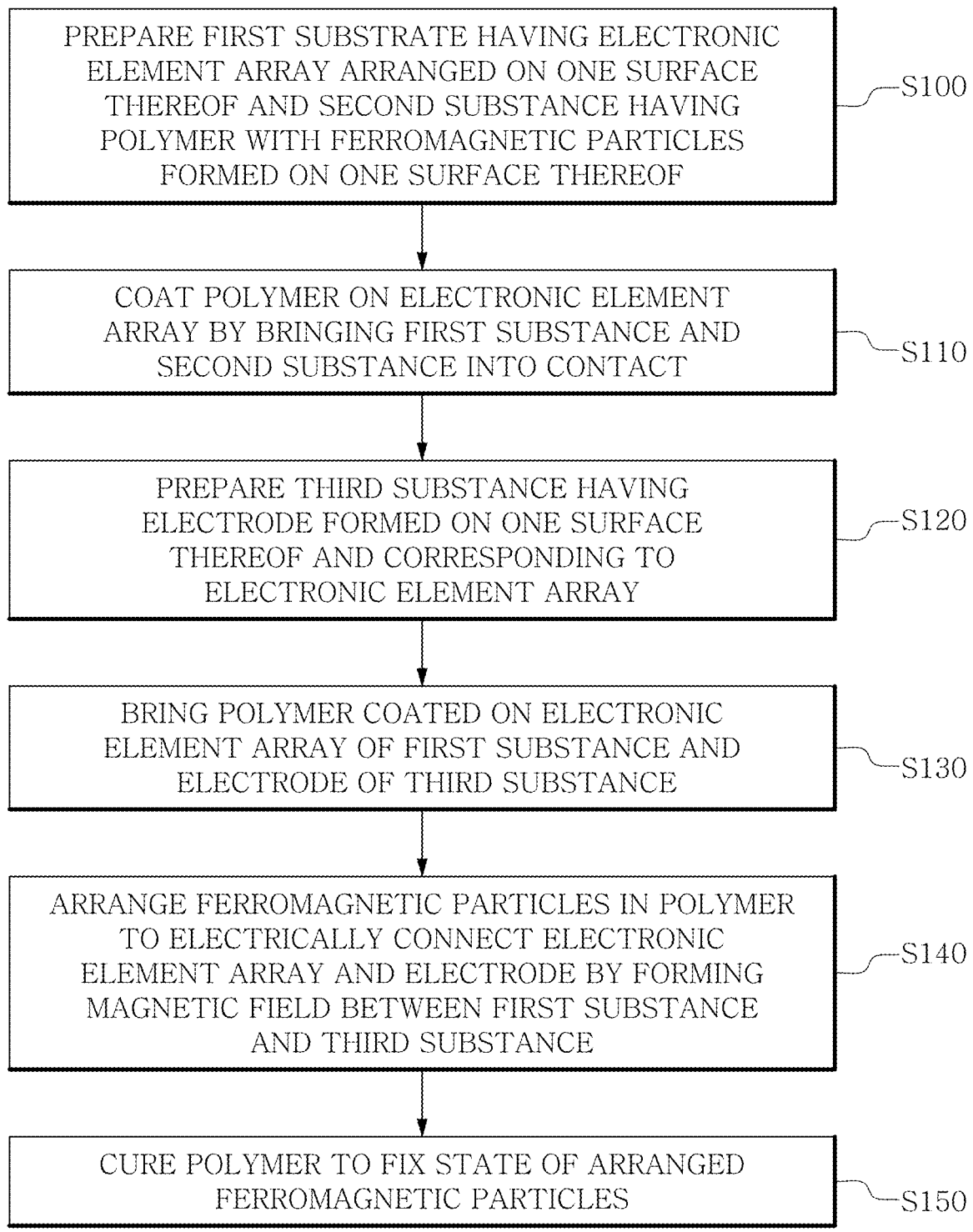
FIG. 1 is a flowchart for illustrating a method of transferring an electronic element according to an embodiment of the present disclosure.

FIG. 1 is a flowchart for illustrating a method of transferring an electronic element according to an embodiment of the present disclosure.

Referring to FIG. 1, a method of transferring an electronic element according to an embodiment of the present disclosure includes preparing a first substrate having an electronic element array arranged on one surface thereof and a second substrate having a polymer with ferromagnetic particles formed on one surface thereof (S100); coating the polymer on the electronic element array by bringing the electronic element array of the first substrate and the polymer of the second substrate into contact (S110); preparing a third substrate having an electrode formed on at least one surface thereof and corresponding to the electronic element array (S120); bringing the polymer coated on the electronic element array of the first substrate and the electrode of the third substrate into contact (S130); arranging the ferromagnetic particles in the polymer to electrically connect the electronic element array and the electrode by forming a magnetic field between the first substrate and the third substrate (S140); and curing the polymer to fix the state of the arranged ferromagnetic particles (S150).

First, a first substrate having an electronic element array arranged on one surface thereof and a second substrate having a polymer with ferromagnetic particles formed on one surface thereof are prepared (S100).

Figure 2:
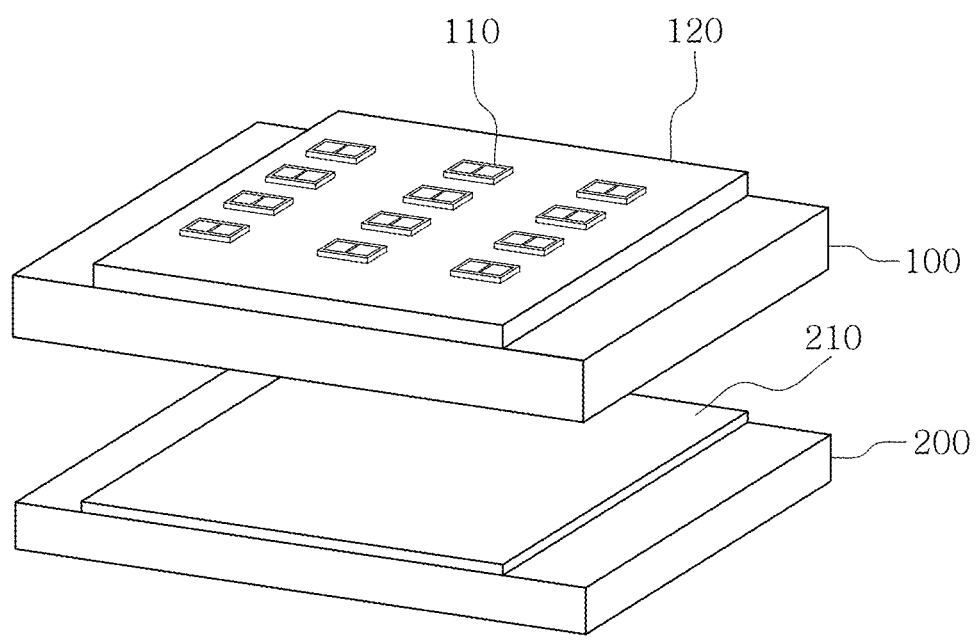
FIGS. 2 and 3 are schematic views exemplarily showing a prepared first substrate and a prepared second substrate according to an embodiment of the present disclosure.
Figure 3:
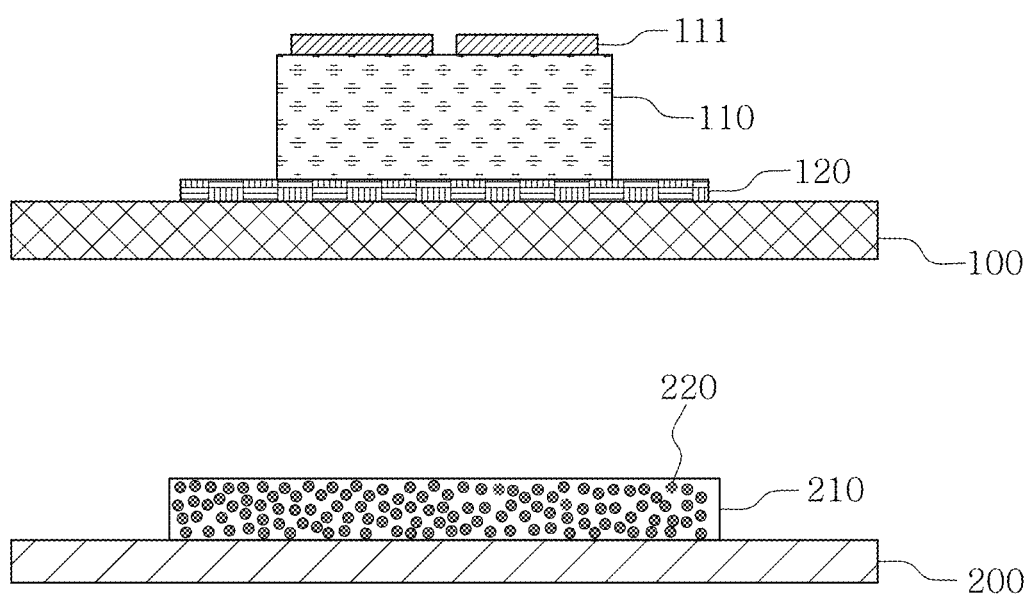

FIGS. 2 and 3 are schematic views exemplarily showing a prepared first substrate and a prepared second substrate according to an embodiment of the present disclosure. Specifically, FIG. 2 is a perspective view from which the overall configuration of the first substrate and the second substrate may be checked, and FIG. 3 is a cross-sectional view for illustrating the relationships among components based on one electronic element 110.

Referring to FIGS. 2 and 3, the first substrate having an electronic element array 110 arranged on one surface thereof is prepared. On the first substrate 100, a plurality of electronic elements 110 are arranged in an array form. The plurality of electronic elements 110 shown in FIGS. 2 and 3 are just an example, and the number and configuration of the plurality of electronic elements 110 are not limited thereto.

The electronic element array 110 arranged on the first substrate 100 may be transferred at once to a substrate on which other components are formed for the fabrication of an electronic device. The electronic element array 110 may be a micro LED element. Here, the micro LED device generally means a device smaller than 100 μm×100 μm (length× width). However, the present disclosure is not limited thereto, and the method of transferring an electronic element according to the embodiment of the present disclosure may be applied not only to micro LED elements (horizontal type, vertical type) of various sizes and types, but also to other micro electronic elements.

The first substrate 100 may be a free substrate, but is not limited thereto. The first substrate 100 may be a carrier substance for delivering the electronic element array 110 to another substrate, and may be removed after the process described later is over. The first substrate 100 and the electronic element array 110 may be temporarily connected through an adhesive layer 120. Further, each electronic element 110 may include a contact pad 111 for electrical connection.

The second substance 200 having the polymer 210 with ferromagnetic particles 220 formed on one surface thereof is prepared. The second substance 200 may be a glass substance, but is not limited thereto. The polymer 210 may be coated to one surface of the second substance 200 through blade coating or the like. The polymer 210 may be formed on one surface of the second substance 200 to have an area corresponding to the total area of the electronic element array 110. For example, the total area of the polymer 210 may be larger than the total area of the electronic element array 110.

The polymer 210 coated on one surface of the second substrate 200 may be an anisotropic conductive adhesive (ACA). That is, the polymer 210 corresponds to a material capable of simultaneously providing mechanical and process properties of a polymer along with electrical, magnetic and optical properties of a metal by mixing metal particles in a polymer binder. The polymer 210 may be a curable polymer, and may be cured by a certain temperature condition or a specific wavelength to fix a current shape. Through the polymer 210, other components may be physically connected and coupled. In other words, the polymer 210 may provide an adhesive function for fixing the electronic element 110 to other components.

The ferromagnetic particles 220 distributed inside the polymer 210 are metal particles that may provide electrical, magnetic and optical properties of a metal. That is, different components may be electrically connected through the ferromagnetic particles 220. In addition, the ferromagnetic particles 220 are particles that are greatly affected by an external magnetic field, and a location inside the polymer 210 may be changed according to the direction of the external magnetic field. That is, the orientation of the ferromagnetic particles 220 inside the polymer 210 may be determined by the external magnetic field.

Next, the polymer is coated on the electronic element array by bringing the electronic element array of the first substrate and the polymer of the second substrate into contact (S110).

Figure 4:
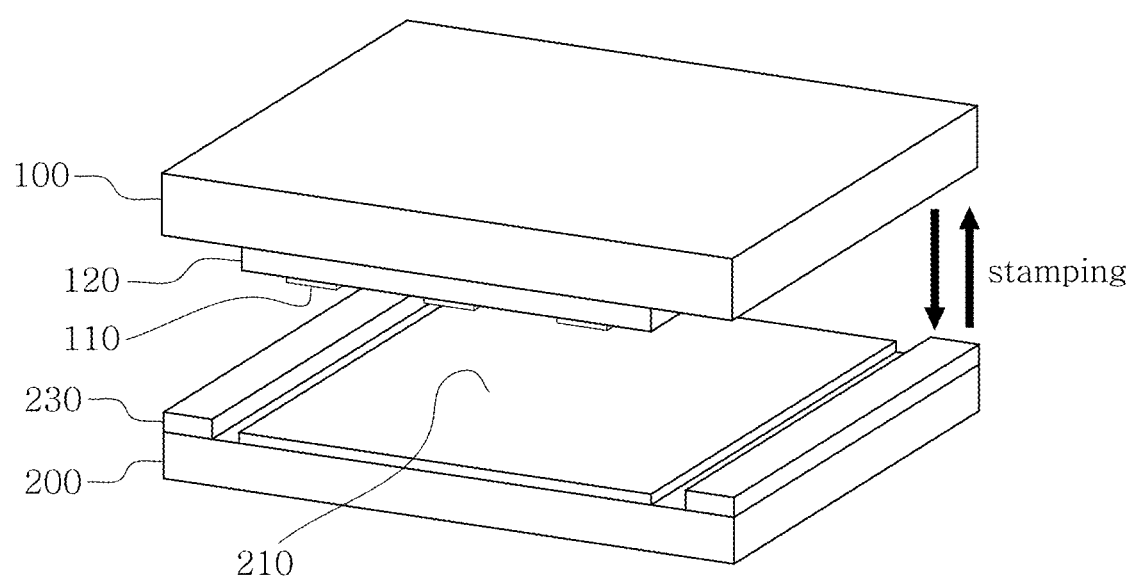
FIGS. 4 and 5 exemplarily illustrate a process of bringing the first substrate and the second substrate into contact according to an embodiment of the present disclosure.
Figure 5:
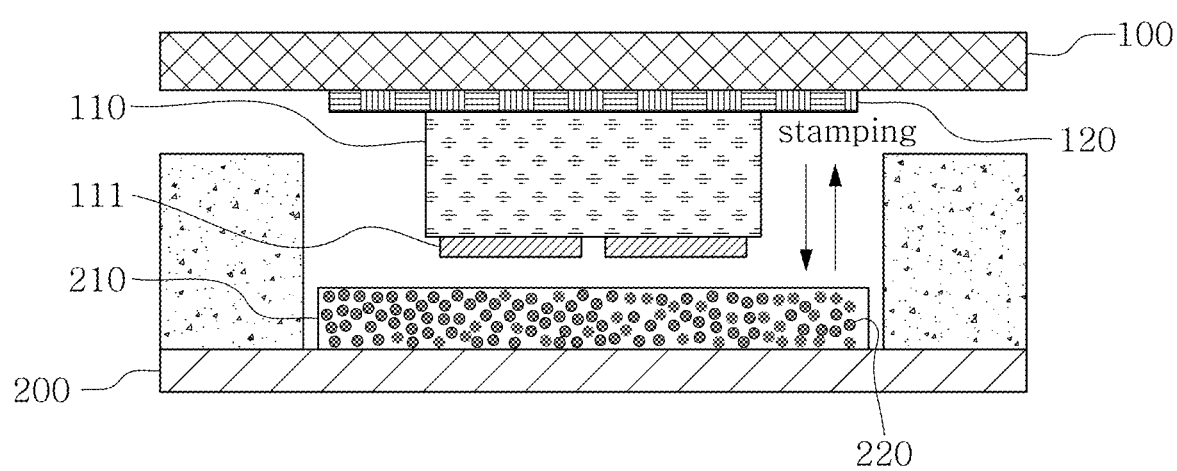
Figure 6:
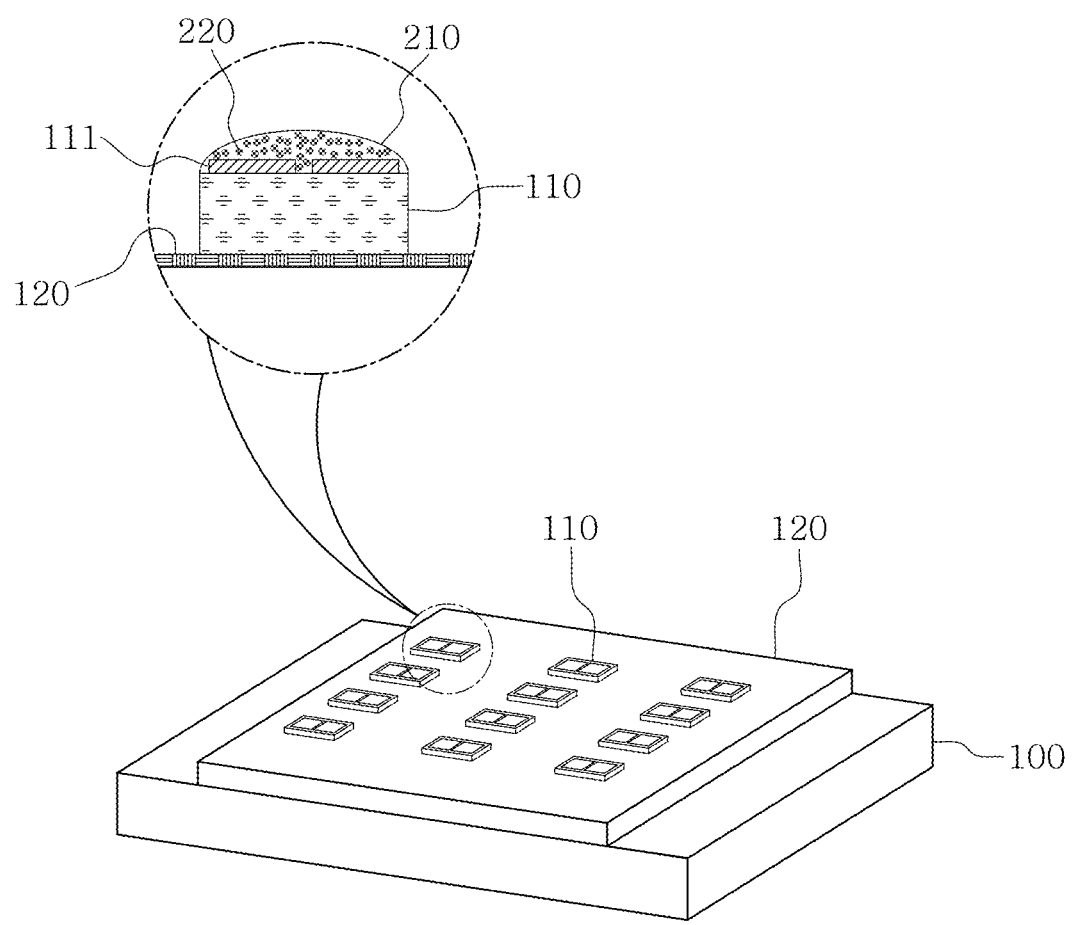
FIG. 6 exemplarily shows a state where a polymer is coated on an electronic element array according to an embodiment of the present disclosure.

FIGS. 4 and 5 exemplarily illustrate a process of bringing the first substrate and the second substrate into contact, and FIG. 6 exemplarily shows a state where a polymer is coated on an electronic element array according to an embodiment of the present disclosure. Specifically, FIG. 4 is a perspective view from which the overall configuration of the first substrate and the second substrate may be checked, and FIG. 5 is a cross-sectional view for illustrating the relationships among components based on one electronic element 110.

Referring to FIGS. 4 and 5, one surface of the first substrate 100 and one surface of the second substrate 200 may be positioned to face each other. That is, the first substrate 100 and the second substrate 200 may be positioned such that the electronic element array 110 of the first substrate 100 and the polymer 210 of the second substrate 200 face each other. At least one of the first substrate 100 and the second substrate 200 may be vertically moved such that the distance between the first substrate 100 and the second substrate 200 is reduced in a state of being positioned to face each other. As the distance between the first substrate 100 and the second substrate 200 decreases, the electronic element array 110 of the first substrate 100 and the polymer 210 of the second substrate 200 may be brought into contact. According to the contact, the polymer 210 is coated on the electronic element array 110 of the first substrate 100. That is, a portion of the polymer 210 of the second substrate 200 is coupled to the electronic element array 110 and moved. After the polymer 210 is moved to the surface of the electronic element array 110 during a certain amount of time or by a sufficient amount, at least one of the first substrate 100 and the second substrate 200 is vertically moved such that the distance between the first substrate 100 and the second substrate 200 is increased.

Through the stamping process as described above, the electronic element array 110 of the first substrate 100 and the polymer 210 of the second substrate 200 are brought into contact, and the polymer 210 of the second substrate 200 is selectively moved to the electronic element array 110 of the first substrate 100.

Referring to FIG. 6, it may be found that the polymer 210 is coated on the electronic element array 110 so that the polymer 210 covers the entire contact pad 111 of the electronic element array 110. In addition, since the polymer 210 has an area corresponding to the total area of the electronic element array 110 or an area capable of covering the entire area of the electronic element array 110, the polymer 210 may be coated on all electronic elements included in the electronic element array 110 in a single stamping process. That is, a separate coating process for the electronic element of a micro size included in the electronic element array 110 is unnecessary, and the polymer 210 may be coated and applied for physically and electrically coupling the electronic elements just with a single stamping process.

Here, the second substrate 200 may further include a spacer 230 that limits a contact distance with the first substrate 100. The spacer 230 may be formed on one surface of the second substrate 200, or may be formed in a region corresponding to the outside of the polymer 210. For example, the spacer 230 may be formed corresponding to an edge region or a corner region of the second substrate 200, but is not limited thereto. The spacer 230 may be formed to have a certain height. By the spacer 230, the conditions under which the stamping process is performed to the first substrate 100 and the second substrate 200 may be limited. The distance by which the first substrate 100 and the second substrate 200 move closer or the distance for contact may be limited by the height of the spacer 230. That is, the degree to which the electronic element array 110 and the polymer 210 are brought into contact and the degree to which the polymer 210 is coated may be determined by the spacer 230. In addition, the close contact of the first substrate 100 and the second substrate 200 may be prevented by the spacer 230, so that the electronic element array 110 may be prevented from being damaged by the stamping process.

Next, a third substrate having an electrode corresponding to the electronic element array formed on one surface thereof is prepared (S120).

Figure 7:
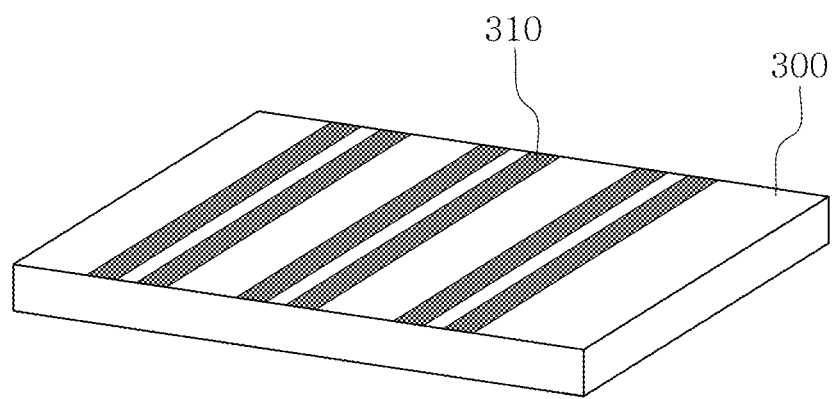
FIG. 7 is a schematic view exemplarily showing a prepared third substance according to an embodiment of the present disclosure.

FIG. 7 is a schematic view exemplarily showing a prepared third substrate according to an embodiment of the present disclosure. Referring to FIG. 7, a third substrate 300 having an electrode 310 corresponding to at least the electronic element array 110 is prepared. The third substrate 300 may be a substrate that further includes a configuration necessary for the operation of the electronic element. That is, the third substrate 300 corresponds to a substrate that receives the electronic element from the first substrate 100 serving as a carrier substance. The third substrate 300 may be a glass substrate, but is not limited thereto. The third substrate 300 may be a flexible substrate. For example, the third substrate 300 may be made of plastic or silicone rubber. That is, by transferring the electronic element onto the flexible substrate through the transferring method according to the embodiment of the present disclosure, a flexible display or a stretchable display may be implemented more easily.

The electrode 310 may optimize a pattern size and spacing as desired using the inkjet printing technology, and a photo process using a mask is also applicable.

Next, the electronic element array 110 of the first substrate 100 may be transferred to the third substrate 300. The electronic element array 110 of the first substrate 100 may be transferred to the third substrate 300 and physically and electrically connected to a corresponding electrode of the third substrate 300. This transfer process is performed by bringing the polymer coated on the electronic element array of the first substrate and the electrode of the third substrate into contact (S130); arranging the ferromagnetic particles in the polymer to electrically connect the electronic element array and the electrode by forming a magnetic field between the first substrate and the third substrate (S140); and curing the polymer to fix the state of the arranged ferromagnetic particles (S150).

Figure 8:
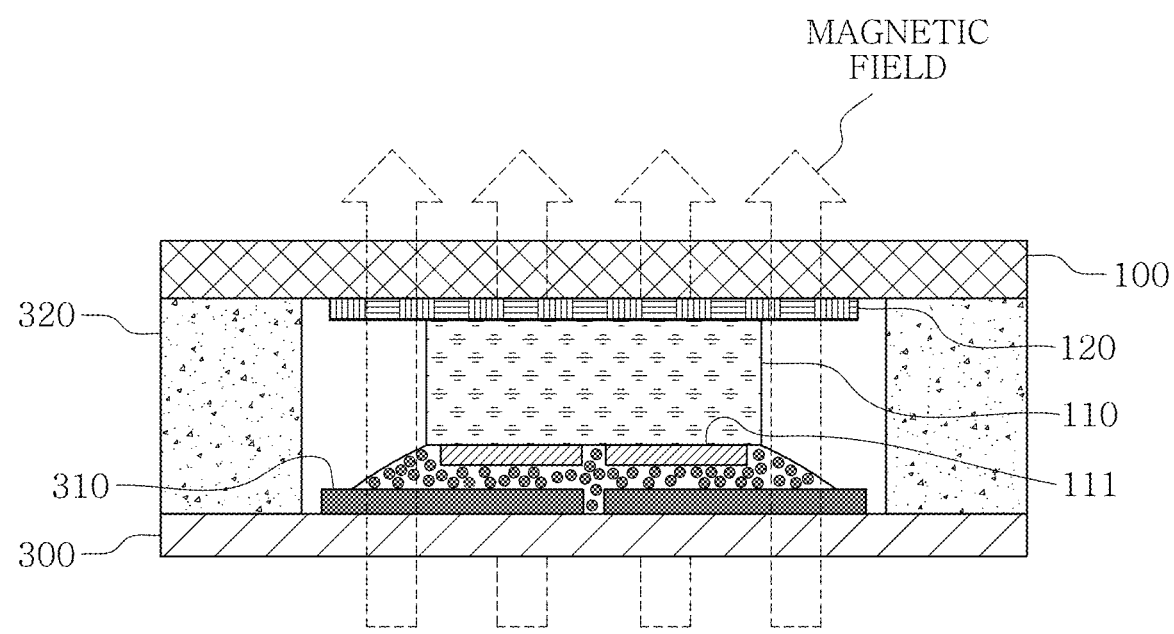
FIG. 8 shows a state where a magnetic field is formed at the electronic element array of the first substrate in contact in order to electrically connect the polymer to an electrode of the third substrate according to an embodiment of the present disclosure.

FIG. 8 shows a state where a magnetic field is formed at the electronic element array of the first substrate in contact in order to electrically connect the polymer to an electrode of the third substrate according to an embodiment of the present disclosure. FIG. 8 exemplarily shows a pair of electrodes 310 corresponding to one electronic element 110, but the following process is performed simultaneously between the electronic element array 110 of the first substrate 100 and the electrode 310 of the corresponding third substrate 300. That is, as one process is performed, the electronic element array 110 of the first substrate 100 is easily transferred to the third substrate 300, and physical and electrical connections are also performed between them.

Figure 9:
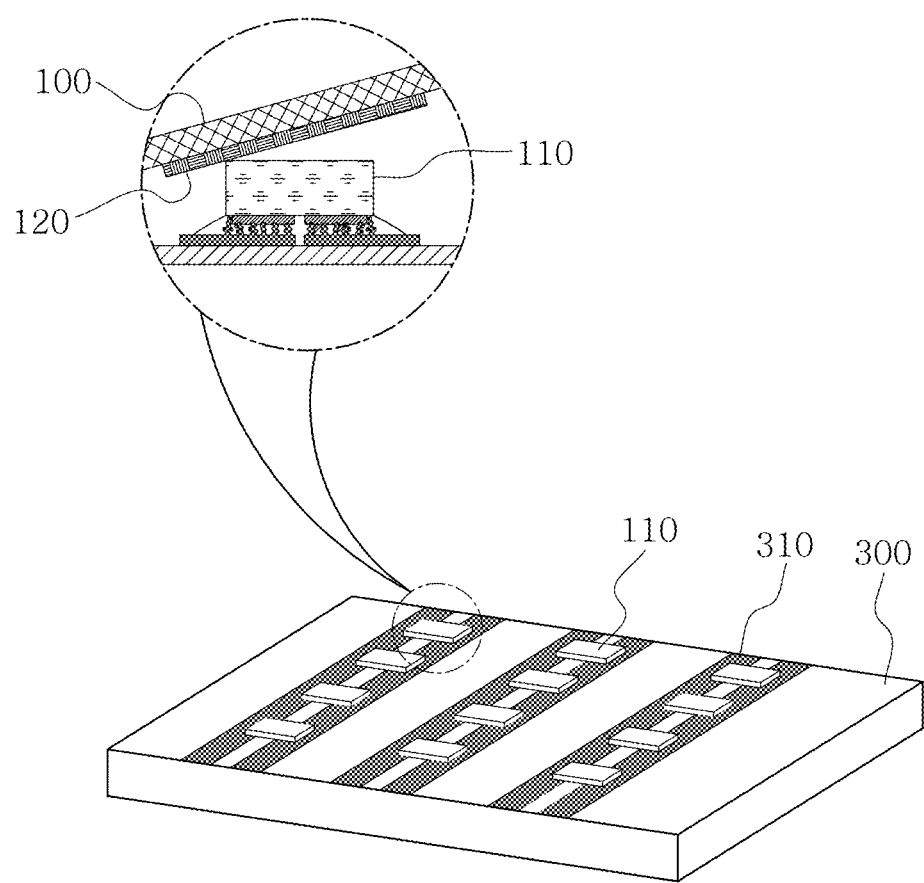
FIGS. 9 and 10 show a state where an electronic element is transferred using the third substrate according to the transferring method described above according to an embodiment of the present disclosure.

As shown in FIG. 8, the electronic element array 110 of the first substrate 100 may be positioned to face the electrode 310 of the corresponding third substrate 300. FIG. 9 show a state where the electronic element is transferred to the third substrate according to the transfer method described above.

The polymer 210 coated on the electronic element array 110 of the first substrate 100 and the electrode 310 of the third substrate 300 may be positioned to face each other, and as at least one of the first substrate 100 and the third substrate 300 is moved, the coated polymer 210 and the electrode 310 are brought into contact. The first substrate 100 and the third substrate 300 may be brought closer so that the polymer 210 is sufficiently moved to the electrode 310. The third substrate 300 may further include a spacer 320 that restricts the distance between the first substrate 100 and the third substrate 300 to keep the distance between the first substance 100 and the third substrate 300. However, the present disclosure is not limited thereto, and in addition to a method of interposing a substrate of a specific height between two substrates, an appropriate gap may be created between two substrates using a finely adjustable mechanical device.

In a state where the polymer 210 is sufficiently moved to electrode 310, a magnetic field is formed between the first substrate 100 and the third substrate 300 to arrange the ferromagnetic particles 220 in the polymer 210 so that the electronic element array 110 and the electrode 310 are electrically connected. An electrode for forming a magnetic field may be disposed at a lower portion of the first substrate 100 and an upper portion of the third substrate 300, respectively, and the magnetic field may be formed in a vertical direction. The ferromagnetic particles 220 are rearranged in the polymer 210 to correspond to the direction of the formed magnetic field. That is, according to the magnetic field, the ferromagnetic particles 220 are self-aligned in the polymer 210. For example, according to the magnetic field formed in the vertical direction, the ferromagnetic particles 220 are self-aligned in the polymer 210 in the vertical direction. The ferromagnetic particles rearranged in the vertical direction have a pillar shape, and the contact pad 111 of the electronic element array 110 and the electrode 310 are electrically connected to each other by the rearranged ferromagnetic particles.

The polymer 210 may be cured so that the state and shape of the rearranged ferromagnetic particles are fixed. If the formed magnetic field is removed, the position of the ferromagnetic particles 220 in the polymer 210 may be changed again. In order to prevent the ferromagnetic particles 220 from moving in the polymer 210, the polymer 210 is cured. Since the state of the ferromagnetic particles 220 rearranged by curing the polymer 210 is maintained, the electrical connection between the electronic element array 110 and the electrode 310 may be maintained. That is, the state where the electrical flow is possible in the vertical direction is fixed, and since the ferromagnetic pillars aligned along the magnetic field have anisotropic conduction characteristics, no electrical short circuit occurs between the electrode and the element.

In addition, by curing the polymer 210, the electronic element array 110 and the electrode 310 may be physically connected. That is, the electronic element array 110 may be physically fixed to the third substrate 300 through the polymer 210. The polymer 210 may be a heat-curing polymer that is cured according to a certain temperature condition, and S150 may include curing the polymer 210 by maintaining a constant temperature for a period of time in a state where a magnetic field is formed. However, the present disclosure is not limited thereto, and the polymer 210 may be a photo-curing polymer that is cured by a specific wavelength, and S150 may also include curing the polymer 210 by irradiating light of a wavelength band for curing for a period of time in a state where a magnetic field formed.

In addition, S150 may further include transferring a pressure in the vertical direction to the first substrate 100 and the third substrate 300 to be compressed such that the vertical distance between the first substrate 100 and the third substrate 300 is reduced. Through the compressing, the electronic element array 110 and the electrode 310 may be physically connected more efficiently by the polymer 210.

After S150 of curing the polymer so that the state of the arranged ferromagnetic particles is fixed, separating the first substrate 100 from the electronic element array 110 by removing the connection between the adhesive layer 120 and the electronic element array 110 is performed. Accordingly, the electronic element array 110 is completely transferred to the third substrate 300.

Figure 10:
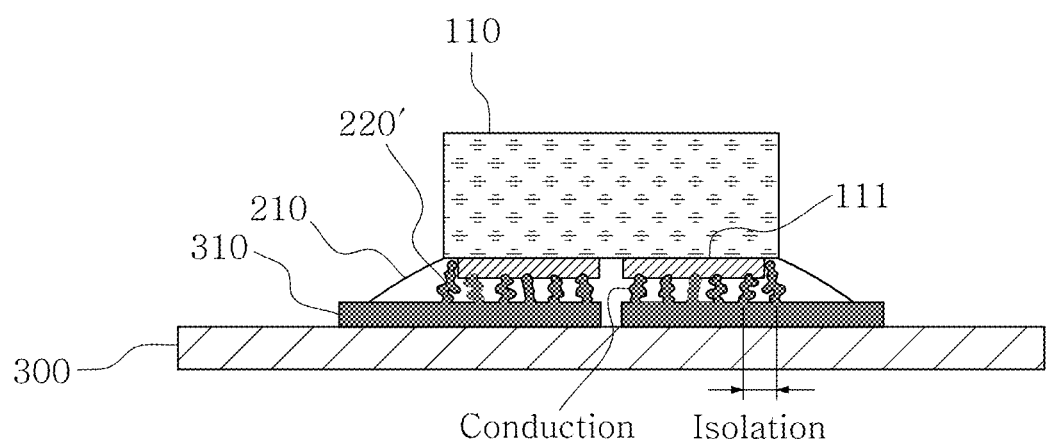

As shown in FIG. 9, it may be found that the electronic element array 110 included in the corresponding conventional first substrate 100 is transferred to the third substrate 300 and positioned on the corresponding electrode 310. In addition, as shown in FIG. 10, ferromagnetic particles 220' arranged in the polymer 210 are respectively connected to the electrode 310 and the contact pad 111 of the electronic element array 110, thereby enabling electrical connection therebetween.

An electronic device according to another embodiment of the present disclosure may include an electronic element transferred through the transferring method according to FIGS. 1 to 10 described above. The schematic configuration of the electronic device may be seen in FIGS. 9 and 10. Specifically, the electronic device according to this embodiment includes a substrate 300; an electrode 310 formed on the substrate; an electronic element 110 electrically connected to the electrode 310; and a cured polymer 210 positioned between the electrode and the electronic element, wherein the cured polymer 210 includes a plurality of ferromagnetic particles 220' arranged in one direction, and the electrode 310 and the electronic element 110 may be electrically connected through the plurality of ferromagnetic particles 220'. Here, the electronic element 110 may be a micro LED.

FIGS. 11 to 18 show an example where an electronic element is transferred using the transferring method of FIGS. 1 to 10 according to an embodiment of the present disclosure. In an embodiment of FIGS. 11 to 18, conditions of each component are as follows. The first substrate 100, the second substrate 200 and the third substrate 300 may be prepared as a glass substrate of 700 μm. The electronic element 110 corresponds to a micro LED including a contact pad, and has a vertical height of 80 μm. The adhesive layer 120 had a thickness of 100 μm, the spacer 230 of the second substrate has 180 μm, the polymer 210 of the second substrate has 60 μm, and the spacer 320 of the third substrate is as 155 μm. S100, S110, S130 and S140 are carried out at room temperature, S150 is carried out at 170° C. in a thermal curing process. The electrode 310 of S130 is prepared through an inkjet printing process.

Figure 11:
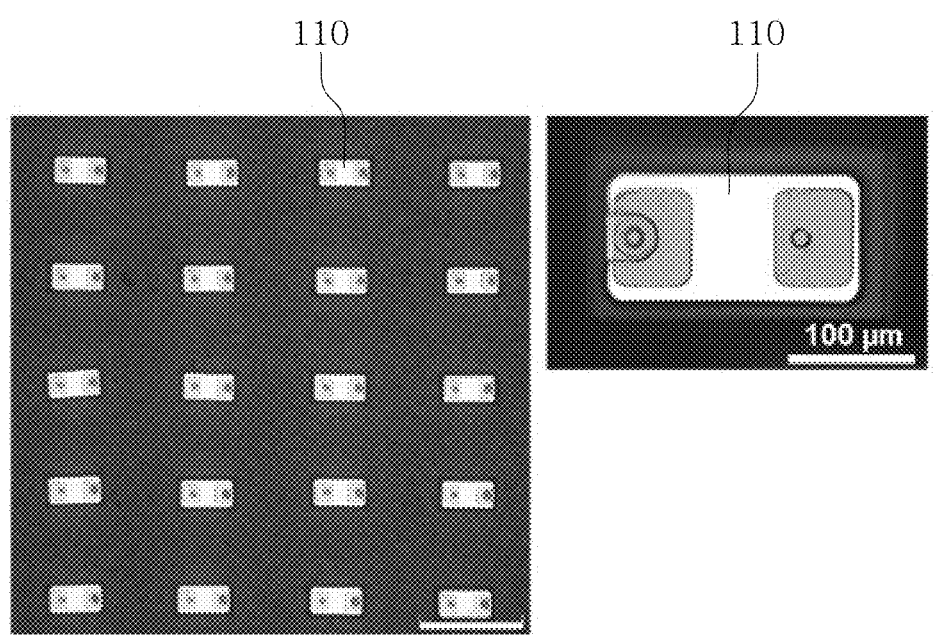
FIGS. 11 to 18 show an example where an electronic element is transferred using the transferring method of FIGS. 1 to 10 according to an embodiment of the present disclosure.
Figure 12:
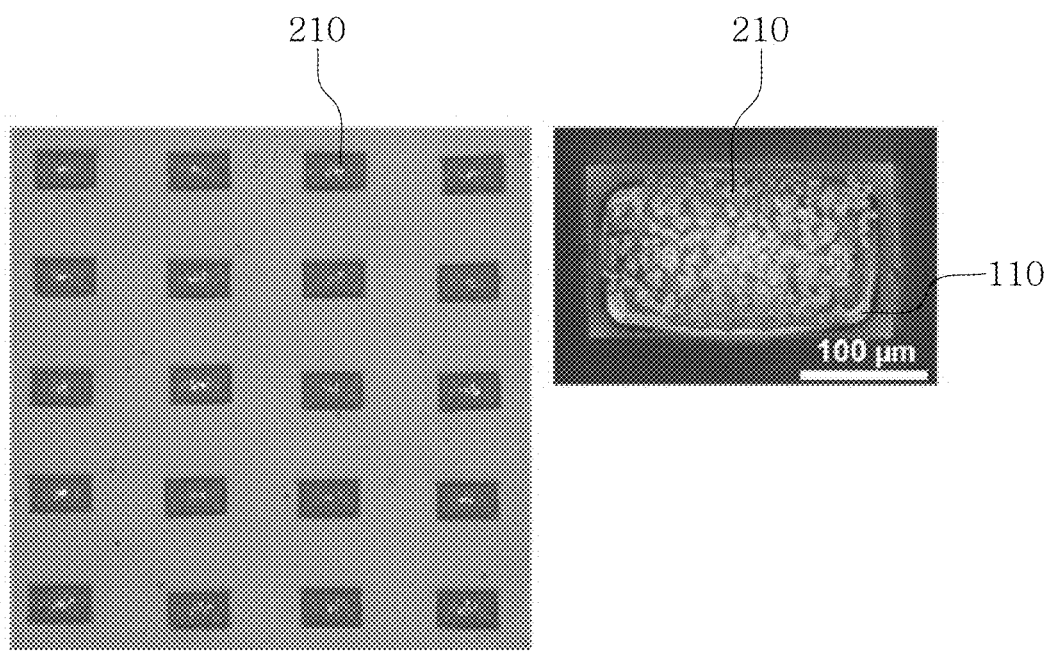

FIGS. 11 and 12 show the electronic element 110 before and after the stamping process.

Comparing FIGS. 11 and 12, it may be seen that the polymer 210 is coated on the electronic element 110 (micro LED) through the stamping process. Depending on the thickness condition of the polymer 210, the amount of polymer 210 coated on the electronic element 110 (micro LED) may be changed.

Figure 13:
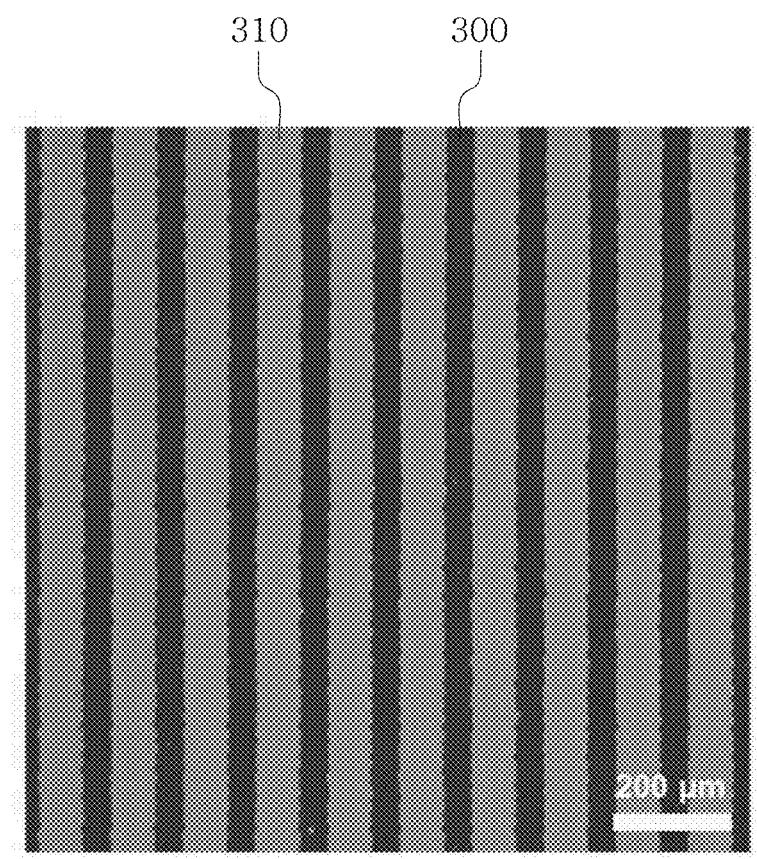
Figure 14:
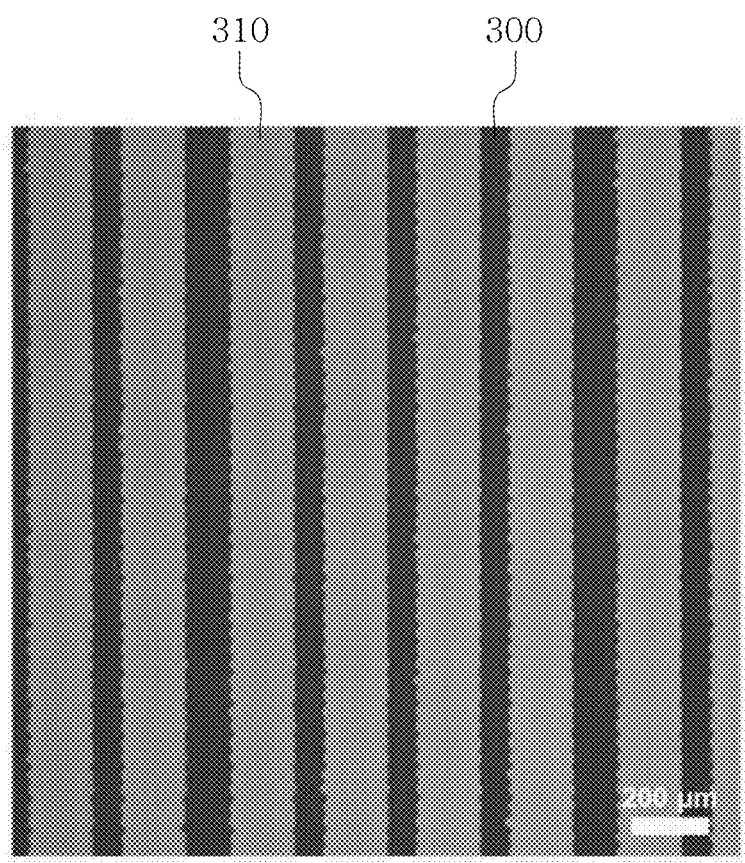

FIGS. 13 and 14 show electrodes 310 prepared to have various widths on the third substrate 300. The electrode 310 may optimize a pattern size and spacing as desired using the inkjet printing technology, and a photo process using a mask is also applicable. For example, FIG. 13 shows a silver electrode 310 with a width of 50 μm prepared by the inkjet printing technology, and FIG. 14 shows a silver electrode 310 with a width of 160 μm prepared by the inkjet printing technology.

Figure 15:
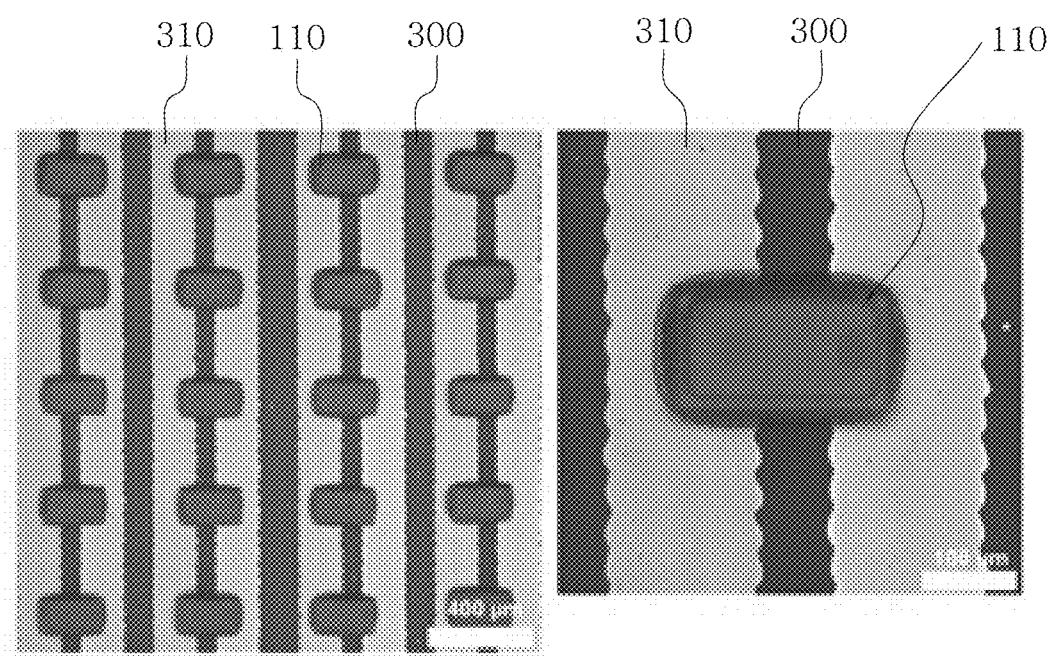
Figure 16:
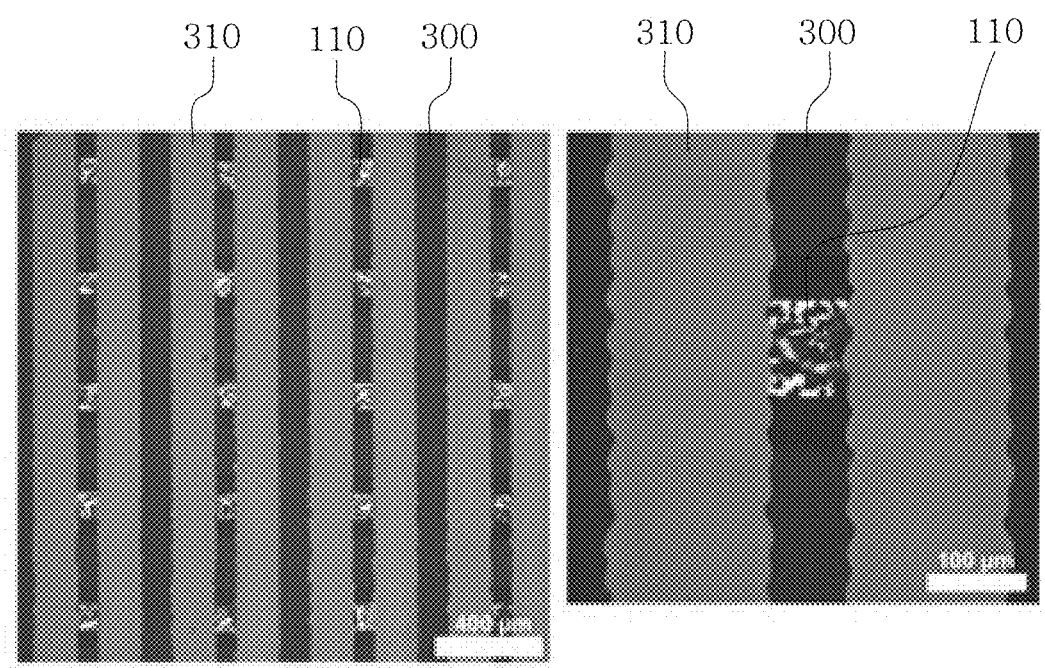
Figure 17:
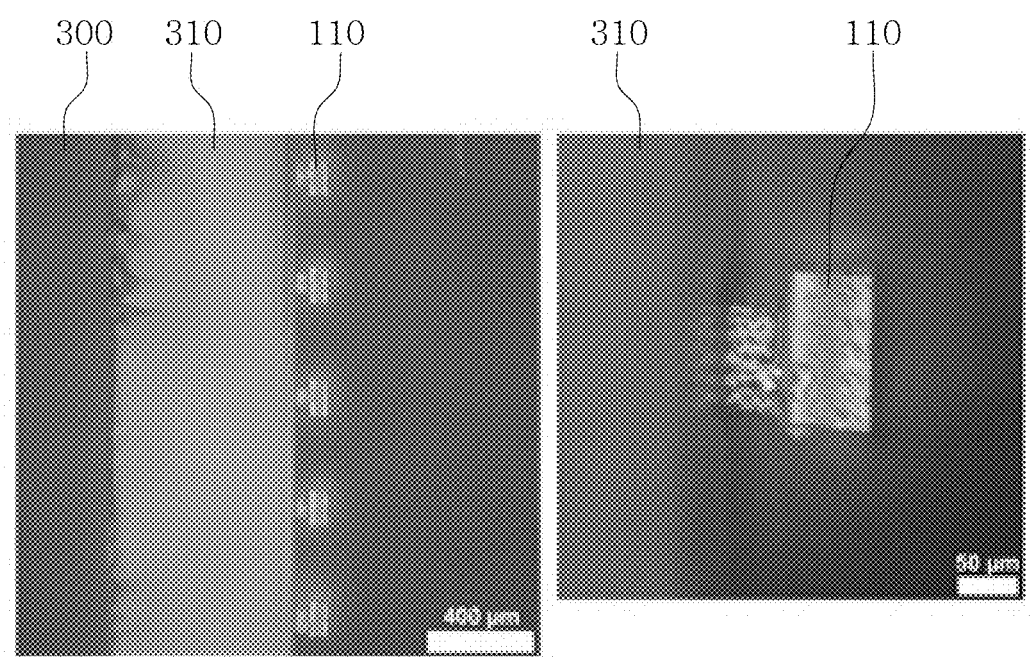

FIGS. 15 to 17 show front, rear and side views of an electronic element 110 array transferred according to an embodiment of the present disclosure. It may be found that the electronic element array 110 (micro LED array) is transferred to correspond to the electrode 310.

Figure 18:
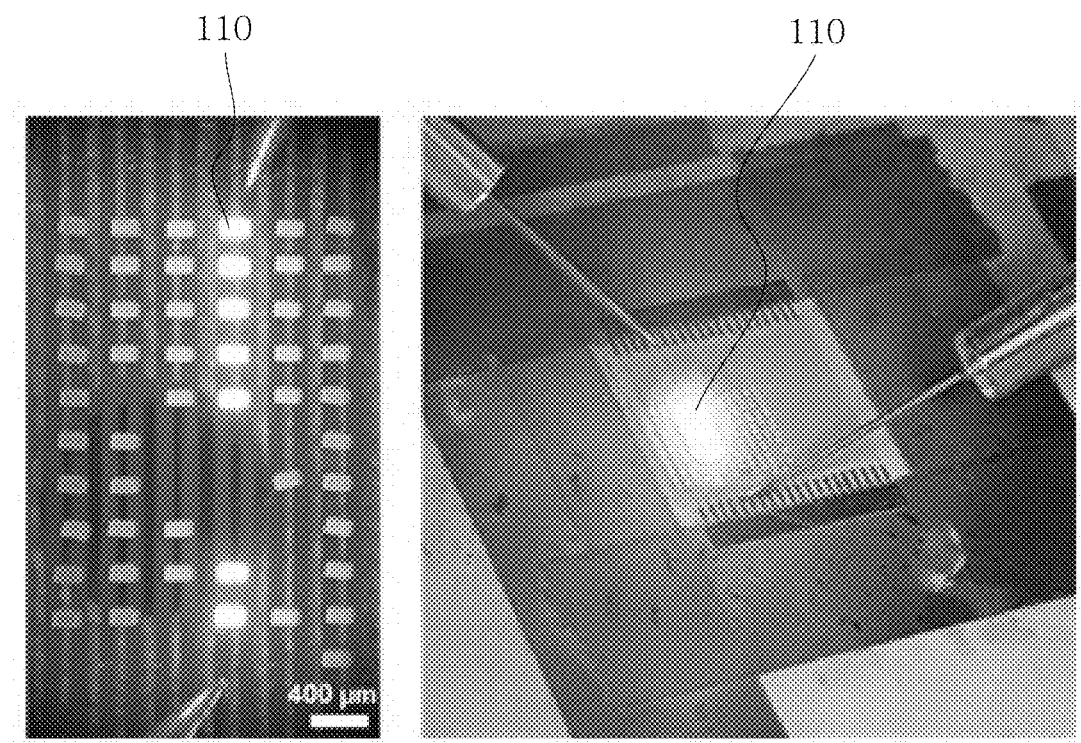

FIG. 18 shows an example of a photograph of an electronic device 110 in operation manufactured using a transfer method according to an embodiment of the present disclosure. The electronic device 110 may be a micro LED, and it may be found that the micro LED emits light in response to a voltage applied thereto.

As described above, the present disclosure proposes an electronic element (micro LED) transferring technology, and it is expected to be widely used in fields such as not only small and large existing displays but also next-generation displays, smart fibers where a fiber and an LED are combined, medical devices attached to or inserted into a human body, bio-contact lenses, HMD and automobiles.

The present disclosure has been described with reference to the embodiments shown in the drawings, but this is only exemplary and those skilled in the art can understand that various changes and modifications can be made from the embodiments. However, it should be considered that such modifications fall within the technical protection scope of the present disclosure. Therefore, the true technical protection scope of the present disclosure should be determined by the technical idea of the appended claims.

What is claimed is:

1. A method of transferring an electronic element, comprising:
   preparing a first substrate having an electronic element array arranged on one surface of the first substrate and a second substrate having a polymer with ferromagnetic particles formed on one surface of the second substrate;
   coating the polymer on the electronic element array by bringing the electronic element array of the first substrate and the polymer of the second substrate into contact;
   preparing a third substrate tance having an electrode formed on at least one surface of the third substrate and corresponding to the electronic element array;
   bringing the polymer coated on the electronic element array of the first substrate and the electrode of the third substrate into contact;
   arranging the ferromagnetic particles in the polymer to electrically connect the electronic element array and the electrode by forming a magnetic field between the first substrate and the third substrate; and
   curing the polymer to fix a state of the arranged ferromagnetic particles,
   wherein the second substrate further includes a plurality of spacers spaced apart from each other, the plurality of spacers restricting a contact distance between the first substrate and the second substrate,
   wherein the polymer of the second substrate is located between the plurality of spacers and remains on the second substrate even after coating the electronic element array, allowing the electronic element array to be coated multiple times.

2. The method of transferring an electronic element according to claim 1,
   wherein the electronic element array is a micro light emitting diode (LED) array.

3. The method of transferring an electronic element according to claim 1,
   wherein in coating the polymer on the electronic element array, the first substrate and the second substrate are brought into contact using a stamping process.

4. The method of transferring an electronic element according to claim 1,
   wherein
   the third substrate further includes a spacer for restricting a contact distance between the first substrate and the third substrate.

5. The method of transferring an electronic element according to claim 1,
   wherein one surface of the first substrate and the electronic element array are connected to each other using an adhesive layer, and
   after the curing the polymer to fix the state of the arranged ferromagnetic particles, the method further comprises separating the first substrate from the electronic element array by removing a connection between the adhesive layer and the electronic element array.

6. The method of transferring an electronic element according to claim 1,
   wherein the curing the polymer to fix the state of the arranged ferromagnetic particles includes transferring a pressure to the first substrate and the third substrate in a vertical direction so that a vertical distance between the first substrate and the third substrate is reduced.

7. The method of transferring an electronic element according to claim 1,
   wherein the magnetic field is provided in a vertical direction between the first substrate and the third substrate, and
   the ferromagnetic particles are arranged in a vertical direction due to the magnetic field provided in a vertical direction.

8. The method of transferring an electronic element according to claim 1,
   wherein the polymer is cured by means of heat curing or photo curing.

9. The method of transferring an electronic element according to claim 1,
   wherein the third substrate is a flexible substrate.

* * * * *